United States Patent
Chen et al.

(10) Patent No.: US 11,854,918 B2
(45) Date of Patent: *Dec. 26, 2023

(54) SEAL RING BETWEEN INTERCONNECTED CHIPS MOUNTED ON AN INTEGRATED CIRCUIT

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW); Chih-Chia Hu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,713

(22) Filed: Jan. 17, 2023

(65) Prior Publication Data
US 2023/0154810 A1 May 18, 2023

Related U.S. Application Data

(63) Continuation of application No. 17/385,939, filed on Jul. 27, 2021, now Pat. No. 11,574,847, which is a continuation of application No. 16/572,612, filed on Sep. 17, 2019, now Pat. No. 11,088,041.

(51) Int. Cl.
*H01L 23/10* (2006.01)
*H01L 23/31* (2006.01)
*H01L 23/522* (2006.01)
*H01L 23/538* (2006.01)
*H01L 25/065* (2023.01)

(52) U.S. Cl.
CPC .......... *H01L 23/10* (2013.01); *H01L 23/3142* (2013.01); *H01L 23/5226* (2013.01); *H01L 23/5384* (2013.01); *H01L 23/5385* (2013.01); *H01L 23/5386* (2013.01); *H01L 25/0657* (2013.01); *H01L 2224/04105* (2013.01)

(58) Field of Classification Search
CPC ... H01L 23/585; H01L 23/5226; H01L 23/10; H01L 23/3142; H01L 23/5384; H01L 23/5385; H01L 23/5386
See application file for complete search history.

(56) References Cited

U.S. PATENT DOCUMENTS

| | | | | |
|---|---|---|---|---|
| 11,088,041 | B2 * | 8/2021 | Chen | H01L 24/20 |
| 11,574,847 | B2 * | 2/2023 | Chen | H01L 25/18 |
| 2014/0035106 | A1 * | 2/2014 | Vu | H01L 25/0655 |
| | | | | 257/E23.18 |
| 2015/0371957 | A1 * | 12/2015 | Wang | H01L 21/78 |
| | | | | 257/620 |

\* cited by examiner

*Primary Examiner* — Alonzo Chambliss
(74) *Attorney, Agent, or Firm* — JCIPRNET

(57) ABSTRACT

A semiconductor package includes a first die. The first die has a first side and a second side different from the first side and includes a first seal ring. The first seal ring includes a first portion at the first side and a second portion at the second side, and a width of the first portion is smaller than a width of the second portion.

20 Claims, 6 Drawing Sheets

SEAL RING BETWEEN INTERCONNECTED CHIPS MOUNTED ON AN INTEGRATED CIRCUIT

CROSS-REFERENCE TO RELATED APPLICATION

This application is a continuation application of and claims the priority benefit of a prior application Ser. No. 17/385,939, filed on Jul. 27, 2021. The prior application Ser. No. 17/385,939 is a continuation application of and claims the priority benefit of a prior application Ser. No. 16/572,612, filed on Sep. 17, 2019. The entirety of each of the above-mentioned patent applications is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1A:
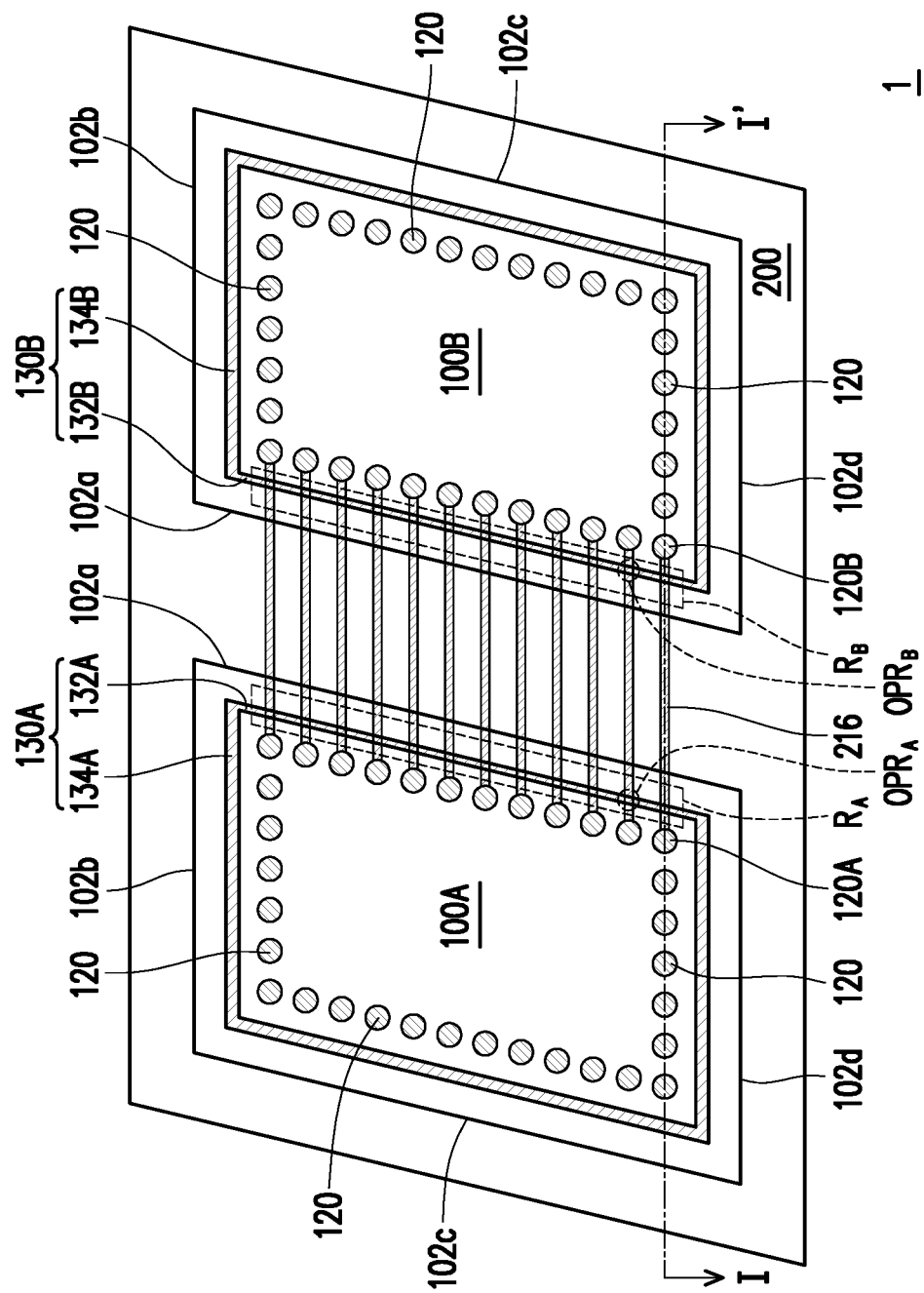
FIG. 1A is a top view of a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
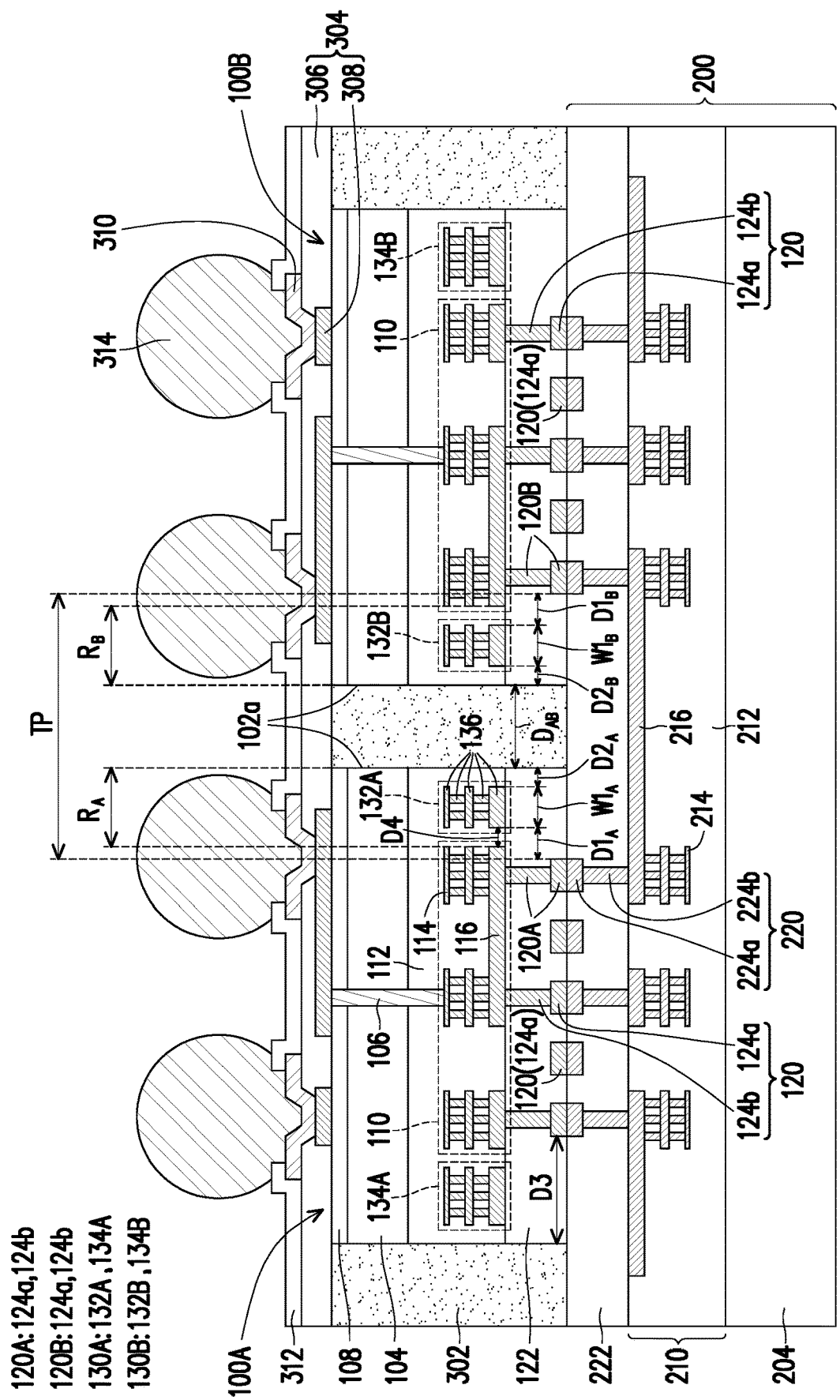
FIG. 1B is a cross-sectional view of a semiconductor package along the line I-I of FIG. 1A in accordance with some embodiments.

FIG. 1A is a top view of a semiconductor package in accordance with some embodiments, and FIG. 1B is a cross-sectional view of a semiconductor package along the line I-I of FIG. 1A in accordance with some embodiments. For simplicity and clarity of illustration, only few elements such as first and second dies, an integrated circuit, seal rings, bonding structures and conductive features are shown in the simplified top view of FIG. 1A, and these elements are not necessarily in the same plane.

Referring to FIGS. 1A and 1B, a first die 100A and a second die 100B are mounted onto the integrated circuit 200. The first and second dies 100A, 100B may be the same type of dies or different types of dies. The first and second dies 100A, 100B may be an application-specific integrated circuit (ASIC) chip, an analog chip, a sensor chip, a wireless and radio frequency chip, a voltage regulator chip or a memory chip, for example. In some embodiments, the first and second dies 100A, 100B may be an active component or a passive component. In some embodiments, the first and second dies 100A, 100B include a semiconductor substrate 104, an interconnect structure 110 and a plurality of bonding structures 120, 120A, 120B.

In some embodiments, the first and second dies 100A, 100B may be rectangular-shaped, and has four sides 102a, 102b, 102c, 102d, for example. The sides 102a, 102b, 102c, 102d are connected to one another. The sides 102a, 102c are longer sides, and the sides 102b, 102d are shorter sides. The side 102a is opposite to and parallel to the side 102c, and the side 102b is opposite to and parallel to the side 102d. In some embodiments, a length of the sides 102a, 102c is 0.5 mm to 55 mm, for example. A length of the sides 102b, 102d is 0.5 mm to 55 mm, for example. In some embodiments, the side 102a of the first die 100A faces to the side 102a of the second die 100B. In some embodiments, the shortest distance $D_{AB}$ between the die 100A and the die 100B is formed between the side 102a of the first die 100A and the side 102a of the second die 100B, which is also referred to as a die-to-die spacing. In some embodiments, the distance $D_{AB}$ may be in a range of 10 μm to 100 μm, for example.

In some embodiments, the semiconductor substrate 104 includes an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 104 is a semiconductor-on-insulator (SOI) substrate. In some alternative embodiments, the semiconductor substrate 104 may take the form of a planar substrate, a substrate with multiple fins, nanowires, or other forms known to people having ordinary skill in the art. Depending on the requirements of design, the semiconductor substrate 104 may be a P-type substrate or an N-type substrate and may have doped regions therein. The doped regions may be configured for an N-type device or a P-type device.

In some embodiments, the semiconductor substrate 104 includes isolation structures defining at least one active area, and a device layer is disposed on/in the active area. The device layer includes a variety of devices. In some embodiments, the devices include active components, passive components, or a combination thereof. In some embodiments, the devices may include integrated circuits devices. The devices are, for example, transistors, capacitors, resistors, diodes, photodiodes, fuse devices, or other similar devices. In some embodiments, the device layer includes a gate structure, source/drain regions, spacers, and the like.

In some embodiments, a through substrate via 106 may be disposed in the semiconductor substrate 104. In some embodiments, the through substrate via 106 is called "a through silicon via" when the semiconductor substrate 104 is a silicon-containing substrate. The through substrate via 106 is electrically connected to the interconnect structure 110 and the to-be-formed redistribution layer structure 304. In some embodiments, the through substrate via 106 includes a conductive via. The conductive via includes copper, a copper alloy, aluminum, an aluminum alloy or a combination thereof. In some embodiments, the through substrate via 106 further includes a diffusion barrier layer between the conductive via and the semiconductor substrate 104. The diffusion barrier layer includes Ta, TaN, Ti, TiN, CoW or a combination thereof. The through substrate via 106 penetrates the semiconductor substrate 104, in other words, the through substrate via 106 is extended between two opposite surfaces of the semiconductor substrate 104. In some embodiments, a dielectric layer 108 may be further formed over a surface (i.e., the back surface) of the semiconductor substrate 104. The through substrate via 106 is extended into the dielectric layer 108 and exposed through the dielectric layer 108. In some embodiments, a surface of the through substrate via 106 may be substantially coplanar with a surface of the dielectric layer 108, for example.

The interconnect structure 110 is disposed over a surface (e.g., front surface) of the semiconductor substrate 104. Specifically, the interconnect structure 110 is disposed over and electrically connected to the device layer. In some embodiments, the interconnect structure 110 includes at least one insulating layer 112 and a plurality of conductive features 114, 116. The conductive features 114, 116 are disposed in the insulating layer 112 and electrically connected with each other. In some embodiments, the insulating layer 112 includes an inter-layer dielectric (ILD) layer on the semiconductor substrate 104, and at least one inter-metal dielectric (IMD) layer over the inter-layer dielectric layer. In some embodiments, the insulating layer 112 includes silicon oxide, silicon oxynitride, silicon nitride, a low dielectric constant (low-k) material or a combination thereof. The insulating layer 112 may be a single layer or a multiple-layer structure. In some embodiments, the conductive features 114, 116 include plugs and metal lines. The plugs may include contacts formed in the inter-layer dielectric layer, and vias formed in the inter-metal dielectric layer. The contacts are formed between and in contact with a metal line and the device layer. The vias are formed between and in contact with two metal lines. The conductive features 114, 116 may include tungsten (W), copper (Cu), a copper alloy, aluminum (Al), an aluminum alloy or a combination thereof. In some embodiments, a barrier layer may be disposed between the conductive features 114, 116 and the insulating layer 112 to prevent the material of the conductive features 114, 116 from migrating to the underlying device layer. The barrier layer includes Ta, TaN, Ti, TiN, CoW or a combination thereof, for example. In some embodiments, the interconnect structure 110 is formed by a dual damascene process. In alternative embodiments, the interconnect structure 110 is formed by multiple single damascene processes. In yet alternative embodiments, the interconnect structure 110 is formed by an electroplating process. It is noted that although the interconnector structure 110 is shown as FIG. 1B, however, the disclosure is not limited thereto, in other words, the interconnector structure 110 may have other suitable configuration.

The bonding structures 120, 120A, 120B are disposed over the surface (e.g., front surface) of the interconnect structure 110 and disposed in at least one bonding dielectric layer 122. In some embodiments, the bonding structures 120A, 120B are disposed along the side 102a, and the bonding structures 120 may be arranged along the sides 102b, 102c, 102d. A distance between the adjacent two bonding structures 120, 120A, 120B may be the same or different. In some embodiments, the bonding structure 120, 120A, 120B includes a bonding conductive feature such as a bonding pad 124a and/or a bonding via 124b. The bonding via 124b is electrically connected to the interconnect structure 110, and the bonding pad 124a is electrically connected to the bonding via 124b. In some embodiments, the bonding dielectric layer 122 includes silicon oxide, silicon nitride, a polymer or a combination thereof. The bonding conductive feature may include tungsten (W), copper (Cu), a copper alloy, aluminum (Al), an aluminum alloy or a combination thereof. In some embodiments, a barrier layer may be disposed between the bonding conductive feature and the bonding dielectric layer 122. The barrier layer includes Ta, TaN, Ti, TiN, CoW or a combination thereof, for example. In some embodiments, the bonding structure 120, 120A, 120B is formed by a dual damascene process. In some alternative embodiments, the bonding structure 120, 120A, 120B is formed by multiple single damascene processes. In some alternative embodiments, the bonding structure 120, 120A, 120B is formed by an electroplating process.

In some embodiments, the conductive feature 116 is physically and electrically connected to the bonding structure 120A, 120B. Specifically, the conductive feature 116 is in contact with the bonding via 124b of the bonding structure 120A, 120B, and the bonding via 124b is disposed between the bonding pad 124a and the conductive feature 116. In some embodiments, the bonding structure 120A, 120B may be extended in a first direction (i.e., a stack direction of the first and second dies 100A, 100B onto the integrated circuit 200), and the conductive feature 116 may be extended in a second direction (i.e., a arranging direction of the first die 100A and the second die 100A) substantially perpendicular to the first direction. In some embodiments, the conductive feature 116 further electrically connects the bonding structures 120, 120A or the bonding structures 120, 120B. In some embodiments, the conductive feature 116 are included in the interconnect structure 110, however, the invention is not limited thereto. For example, in some alternative embodiments, the conductive feature 116 may be other conductive feature disposed in the semiconductor substrate 104, the bonding dielectric layer 122 or other suitable sites and in direct contact with the bonding structure 120A, 120B.

In some embodiments, the first and second dies 100A, 100B further include seal rings 130A, 130B. The seal ring 130A, 130B is disposed over the surface (e.g., front surface) of the semiconductor substrate 104. Specifically, the seal ring 130A, 130B is disposed over and electrically insulated from the device layer, and located aside the interconnect structure 110. In some embodiments, the seal ring 130A, 130B is continuously disposed at the sides 102a, 102b, 102c, 102d, for example. As shown in FIG. 1A, the seal ring 130A, 130B has a ring shape or any suitable shape from a top view. In some embodiments, the bonding structures 120A, 120B are disposed within and surrounded by the seal ring 130A, 130B.

In some embodiments, the seal ring 130A of the first die 100A has a portion 132A and a portion 134A, and the portion 132A and the portion 134A are physically connected. Similarly, the seal ring 130B of the second die 100B has a portion 132B and a portion 134B, and the portion 132B and the portion 134B are physically connected. In some embodiments, the portion 132A, 132B is disposed at the side 102a, and the portion 134A, 134B is disposed at the sides 102b, 102c, 102d. In some embodiments, the portion 132A, 132B may be line-shaped and elongated along the side 102a. The portion 134A, 134B may be U-shaped and continuously disposed along the sides 102b, 102c, 102d. The first portion 132A of the first die 100A is disposed adjacent to the side 102a.

In some embodiments, the shortest distance $D1_A$, $D1_B$ between the bonding structure 120A, 120B and the portion 132A, 132B is the distance between the outermost edge of the bonding pad 124a and the innermost edge of the portion 132A, 132B. In some embodiments, the distance $D1_A$, $D1_B$ may be in a range of 20 µm to 100 µm, for example. In some embodiments, the shortest distance $D2_A$, $D2_B$ between the portion 132A, 132B and the side 102a may be in a range of 5 µm to 100 µm, for example. In some embodiments, the distance $D2_A$, $D2_B$ is also the width of the remained silicon after silicon singulation. In some embodiments, the shortest distance (not shown) between the seal ring 130A, 130B and each side 102a, 102b, 102c, 102d may be substantially the same, for example.

In some embodiments, the portion 132A, 132B has a uniform width $W1_A$, $W1_B$, and the portion 134A, 134B has a uniform width $W2_A$, $W2_B$. The width $W1_A$, $W1_B$ of the portion 132A, 132B is smaller than the width $W2_A$, $W2_B$ of the portion 134A, 134B. That is, a portion of the seal ring 130A, 130B (i.e., the portion 132A, 132B) is narrowed at the side 102a. In some embodiments, the width $W1_A$ is smaller than the width $W2_A$ by at least 5 µm, and the width $W1_B$ is smaller than the width $W2_B$ by at least 5 µm, for example. In some embodiments, the width $W1_A$, $W1_B$ may be in a range of 5 µm to 45 µm, and the width $W2_A$, $W2_B$ may be in a range of 10 µm to 50 µm. In some embodiments, the portion 132A, 132B and the portion 134A, 134B may be formed simultaneously.

Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the surfaces of the elements at substantially the same level are substantially coplanar. For example, as shown in FIG. 1B, the seal ring 130A, 130B is at substantially the same level with the interconnect structure 110. In detail, the seal ring 130A, 130B may include a plurality of conductive features 136 such as conductive lines and plugs between the conductive lines. The conductive features 136 of the seal ring 130A, 130B are at substantially the same level with the conductive features 114, 116 of the interconnect structure 110.

In some embodiments, a region $R_A$, $R_B$ is defined as being between the side 102a and the outermost edge of the interconnect structure 110 (i.e., the outermost edge of the conductive features 114, 116). When an element (such as the portion 132A, 132B of the seal ring 130A, 130B) is disposed in the region $R_A$, $R_B$, a space for the element is required, and a distance between the conductive feature 116 and the side 102a is increased. Furthermore, since the bonding structure 120A, 120B is physically connected to and disposed over the conductive feature 116, a distance between the bonding structure 120A, 120B (i.e., the outermost edge of the bonding pad 124a) and the side 102a is also increased.

Still referring to FIGS. 1A and 1B, the integrated circuit 200 may be an application-specific integrated circuit (ASIC) chip, an analog chip, a sensor chip, a wireless and radio frequency chip, a voltage regulator chip or a memory chip, for example. The integrated circuit 200 and the first and second dies 100A, 100B may be the same type of dies or different types of dies. In some embodiments, the integrated circuit 200 may be an active component or a passive component. In some embodiments, the integrated circuit 200 is larger than a total area of the first and second dies 100A, 100B. In some embodiments, the size of the integrated circuit 200 is larger than the size of the first and second dies 100A, 100B. Herein, the term "size" is referred to the length, width and/or area.

In some embodiments, the integrated circuit 200 includes a semiconductor substrate 204, an interconnect structure 210, a plurality of bonding structures 220 and a plurality of conductive features 216.

The interconnect structure 210 is similar to the interconnect structure 110. Similarly, the interconnect structure 210 is disposed over a surface (e.g., front surface) of the semiconductor substrate 204. Specifically, the interconnect structure 210 is disposed over and electrically connected to the device layer. In some embodiments, the interconnect structure 210 includes at least one insulating layer 212 and a plurality of conductive features 214, 216. The conductive features 214, 216 are disposed in the insulating layer 212 and electrically connected with each other. A portion of the conductive features, such as the outermost conductive features 216, are exposed by the insulating layer 212.

The bonding structure 220 is similar to the bonding structure 120A, 120B. Similarly, the bonding structure 220 is disposed over the surface (e.g., front surface) of the interconnect structure 210. In some embodiments, the bonding structure 220 is disposed in at least one bonding dielectric layer 222 and includes a bonding conductive feature such as a bonding pad 224a and/or a bonding via 224b. The bonding via 224b is electrically connected to the interconnect structure 210, and the bonding pad 224a is electrically connected to the bonding via 224b.

In some embodiments, the first and second dies 100A, 100B and the integrated circuit 200 are face-to-face bonded together with the bonding structures 120A, 120B and the bonding structures 220. In some embodiments, before the first and second dies 100A, 100B are bonded to the integrated circuit 200, the bonding structures 120A, 120B and the bonding structures 220 are aligned, such that the bonding pads 124a are bonded to the bonding pads 224a and the bonding dielectric layer 122 is bonded to the bonding dielectric layer 222. In some embodiments, the alignment of the bonding structure 120A, 120B and the bonding structure 220 may be achieved by using an optical sensing method. After the alignment is achieved, the bonding structure 120A, 120B and the bonding structure 220 are bonded together by a hybrid bonding including a metal-to-metal bonding and a dielectric-to-dielectric bonding.

After the first and second dies 100A, 100B are bonded to the integrated circuit 200, the first and second dies 100A, 100B are electrically connected to the integrated circuit 200, respectively. In addition, the conductive feature 216 electrically connects the first die 100A and the second die 100B directly. Specifically, the conductive feature 216 electrically and physically connects the bonding structure 220 bonded to the bonding structure 120A of the first die 100A and the bonding structure 220 bonded to the bonding structure 120B of the second die 100B. In some embodiments, the terminals of the conductive feature 216 are physically connected to the bonding vias 224b bonded to the bonding structures 120A, 120B of the first and second dies 100A, 100B. The bonding via 224b is disposed between the bonding pads 224a and the conductive feature 216. The conductive feature 216 is elongated between the bonding structure 120A of the first die 100A and the bonding structure 120B of the second die 100B. In some embodiments, the bonding structure 220 may be extended in a first direction (i.e., a stack direction of the first and second dies 100A, 100B onto the integrated circuit 200), and the conductive feature 216 may be extended in a second direction (i.e., a arranging direction of the first die 100A and the second die 100B) substantially perpendicular to the first direction. In some embodiments, the conductive feature 216 are the outermost conductive feature of the interconnect structure 210, however, the invention is not limited thereto. For example, in some alternative embodiments, the conductive feature 216 may be other conductive feature disposed in the semiconductor substrate 204, the bonding dielectric layer 222 or other suitable sites. In addition, the conductive feature 216 may be also referred to as a connecting feature or a bridge structure.

In some embodiments, the portion 132A, 132B of the seal ring 130A, 130B may be extended in a first direction parallel to the side 102a, and the conductive feature 216 may be extended in a second direction substantially perpendicular to the side 102a, for example. Accordingly, as shown in FIG. 1A, from a top view, the conductive feature 216 may be partially overlapped with the portion 132A, 132B of the seal ring 130A, 130B, to form an overlapped region $OPR_A$, $OPR_B$. In some embodiments, the conductive features 216 are substantially parallel to one another, for example. In some embodiments, the conductive features 216 may be parallel to the sides 102a, 102c (such as short sides) of the first and second dies 100A, 100B, for example.

In some embodiments, the conductive feature 216 may be line-shaped, for example. A pitch of the conductive feature 216 may be in a range of 0.04 μm to 5 μm, for example. In some embodiments, the conductive feature 216 may include tungsten (W), copper (Cu), a copper alloy, aluminum (Al), an aluminum alloy or a combination thereof. In some embodiments, a barrier layer may be disposed between the conductive feature 216 and the insulating layer 212. The barrier layer includes Ta, TaN, Ti, TiN, CoW or a combination thereof, for example. In some embodiments, the conductive feature 216 is formed by a dual damascene process. In some alternative embodiments, the conductive feature 216 is formed by multiple single damascene processes. In some alternative embodiments, the conductive feature 216 is formed by an electroplating process.

In some embodiments, the conductive feature 216 electrically connects the bonding structures 120A, 120B which are nearest to each other. Therefore, the conductive feature 216 provides the shortest conductive path between the corresponding bonding structures 120A, 120B. Accordingly, the first die 100A and the second die 100B may be talked to each other efficiently, that is, the conductive feature 216 provides a die-to-die talking path TP. In some embodiments, the conductive feature 216 is disposed across the portion 132A of the seal ring 130A, the spacing between the first die 100A and the second die 100B, and the portion 132B of the seal ring 130B. Therefore, a length of the die-to-die talking path TP is substantially equal to a total of the distance D1A between the portion 132A and the bonding structure 120A of the first die 100A, the width W1A of the portion 132A, the distance D2A between the portion 132A and the side 102a of the first die 100A, the distance DAB between the sides 102a of the first and second dies 100A, 100B, the distance D1B between the portion 132B and the side 102a of the second die 100B, the width W1B of the portion 132B and the distance D2B between the portion 132B and the bonding structure 120B of the second die 100B. In some embodiments, the distance D1A, D2A may depend on the process window of the photolithography or the requirement of insulation between the conductive elements. The distance DAB may depend on the gap-filling capacity of the encapsulant. In some embodiments, by narrowing the portion 132A, 132B of the seal ring 130A, 130B, the width W1A, W1B is reduced. Accordingly, the die-to-die talking path TP may be shortened. In some embodiments, the length of the die-to-die talking path TP may be equal to or less than 70 μm, for example. Furthermore, since the width W1A, W1B of the portion 132A, 132B of the seal ring 130A, 130B at the side 102a is smaller than the width W2A, W2B of the portion 134A, 134B of the seal ring 130A, 130B at other side 102b, 102c, 102d, the distance between the bonding structure 120A and the side 102a is smaller than a distance between the bonding structure 120 and other side 102b, 102c, 102d. For example, the distance (i.e., a total of the distance D1A, the width W1A and the distance D2A) between the bonding structure 120A and the side 102a is smaller than a distance D3 between the bonding structure 120 and the side 102a.

In some embodiments, since the outermost edge of the bonding pad 124a of the bonding structure 120A, 120B is disposed inside the outermost edge of the conductive feature 116, an additional distance is formed between the outermost edge of the bonding pad 124a and the outermost edge of the conductive feature 116. Therefore, the shortest distance $D1_A$, $D1_B$ between the bonding structure 120A, 120B and the portion 132A, 132B is larger than the shortest distance D4 between the conductive feature 116 and the portion 132A, 132B. In some embodiments, the distance D4 is in a range of 20 μm to 100 μm. However, in some alternative embodiments, the bonding structure 120A, 120B may be disposed closer to the portion 132A, 132B, for example, the outermost edge of the bonding structure 120A, 120B may be substantially flush with the outermost edge of the conductive feature 116. Thus, the additional distance is not required. Accordingly, the shortest distance $D1_A$, $D1_B$ may be reduced, and the length of the die-to-die talking path TP is shortened.

In some embodiments, an encapsulant 302, a redistribution layer structure 304, a plurality of pads 310 and a passivation layer 312 are further included in a semiconductor package 1 of FIG. 1B. In some embodiments, the semiconductor package 1 may be a high performance multi-die package which requires extremely short talking path, for example.

The encapsulant 302 is disposed over the integrated circuit 200 and aside the first and second dies 100A, 100B. Specifically, the encapsulant 302 surrounds sides 102a, 102b, 102c, 102d of the first and second dies 100A, 100B, exposes tops of the first and second dies 100A, 100B and overlays the surface (e.g., front surface) of the integrated circuit 200. In some embodiments, the surfaces (e.g., back surfaces) of the first and second dies 100A, 100B are substantially coplanar with the top surface of the encapsulant 302. In some embodiments, the encapsulant 302 includes a molding compound. The molding compound may include a resin and a filler. In alternative embodiments, the encapsulant 302 includes silicon oxide, silicon nitride or a combination thereof. The encapsulant 302 may be formed by spin-coating, lamination, deposition or the like.

In some alternative embodiments, a plurality of through dielectric vias may be disposed in the encapsulant 302 and electrically connected with the interconnect structure 210 and the to-be-formed redistribution layer structure 304. In some embodiments, the through dielectric vias include conductive vias. The conductive vias include copper, a copper alloy, aluminum, an aluminum alloy or a combination thereof. In some embodiments, the through dielectric vias further include a diffusion barrier layer between the conductive vias and the encapsulant 302. The diffusion barrier layer includes Ta, TaN, Ti, TiN, CoW or a combination thereof.

The redistribution layer structure 304 is disposed over the surfaces (e.g., back surfaces) of the first and second dies 100A, 100B and over the encapsulant 302. The redistribution layer structure 304 includes at least one dielectric layer 306 and at least one conductive layer 308 stacked alternately. In some embodiments, a portion of the redistribution layer structure 304 is electrically connected to the through silicon vias 106. In some embodiments, another portion of the redistribution layer structure 304 may be electrically connected to the through dielectric vias, to electrically connect the integrated circuit 200. In some embodiments, the dielectric layer 306 includes a photo-sensitive material such as polybenzoxazole (PBO), polyimide (PI), benzocyclobutene (BCB), a combination thereof or the like. In some embodiments, the conductive layer 308 includes copper, nickel, titanium, a combination thereof or the like.

The pads 310 are disposed over the redistribution layer structure 304. In some embodiments, the pads 310 are under bump metallization (UBM) pads. The pads 310 include a metal or a metal alloy. The pads 310 includes aluminum, copper, nickel, or an alloy thereof.

The passivation layer 312 covers the dielectric layer 306 and edge portions of the pads 310, and exposes the center portions of the pads 310. In some embodiments, the passivation layer 312 includes silicon oxide, silicon nitride, benzocyclobutene (BCB) polymer, polyimide (PI), polybenzoxazole (PBO) or a combination thereof.

The conductive connectors 314 are mounted to the pads 310. In some embodiments, the conductive connectors 314 may be ball grid array (BGA) connectors, solder balls, metal pillars, and/or the like. The conductive connectors 314 may be formed by a mounting process and a reflow process, for example.

In some embodiments, a portion of the seal ring adjacent to another die has a narrower width than other portions of the seal ring. Therefore, the space for the portion of the seal ring may be reduced, and the bonding structure may become closer to another die. Therefore, the talking path between the bonding structures of the adjacent dies may be shortened, and the performance of the semiconductor package may be improved.

Figure 2A:
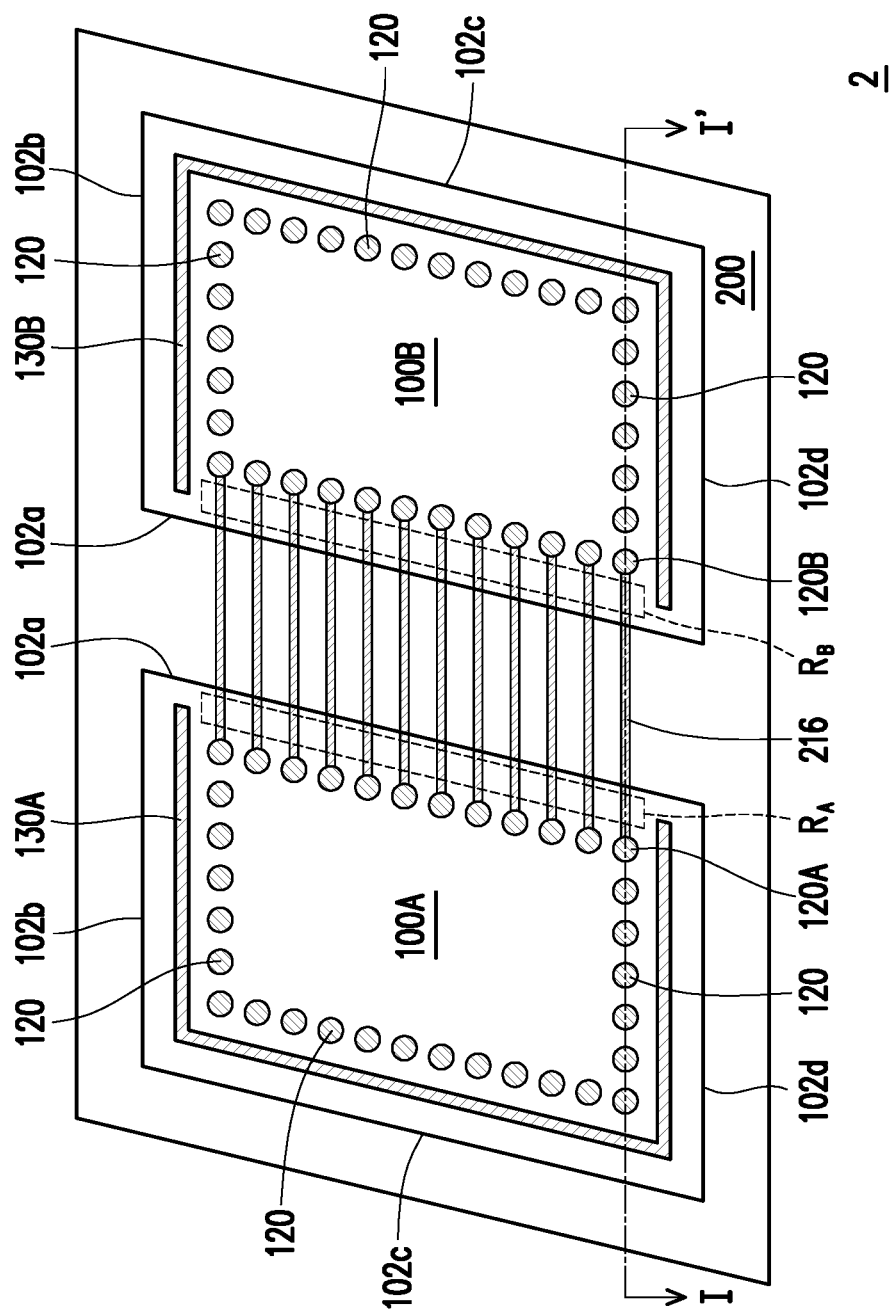
FIG. 2A is a top view of a semiconductor package in accordance with some embodiments.
Figure 2B:
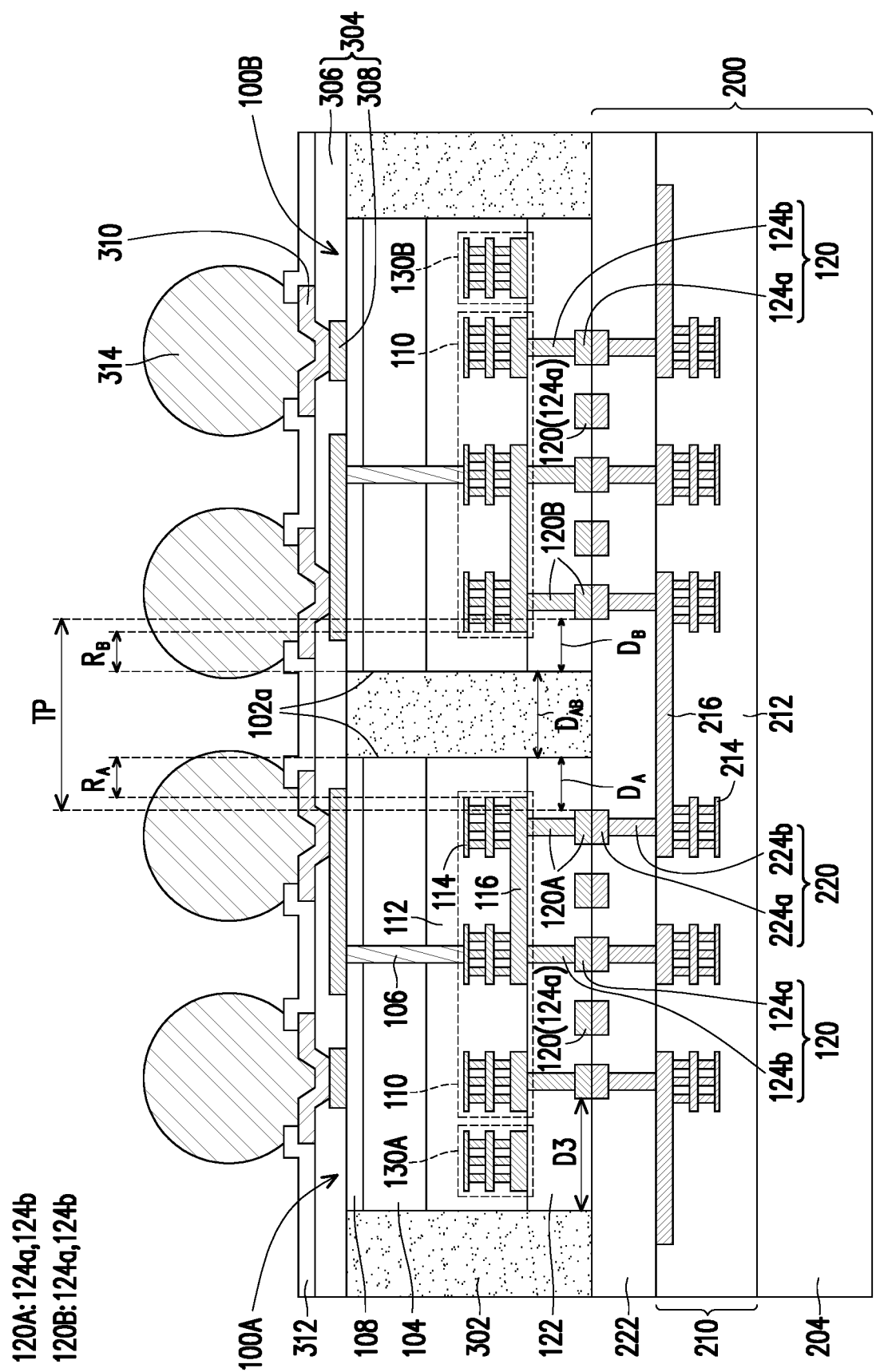
FIG. 2B is a cross-sectional view of a semiconductor package along the line I-I of FIG. 2A in accordance with some embodiments.

FIG. 2A is a top view of a semiconductor package in accordance with some embodiments, and FIG. 2B is a cross-sectional view of a semiconductor package along the line I-I of FIG. 2A in accordance with some embodiments. For simplicity and clarity of illustration, only few elements such as first and second dies, an integrated circuit, seal rings, bonding structures and conductive features are shown in the simplified top view of FIG. 2A, and these elements are not necessarily in the same plane.

The semiconductor package 2 of FIGS. 2A and 2B is similar to the semiconductor package 1 of FIGS. 1A and 1B. Thus, the difference between the semiconductor package 2 and the semiconductor package 1 is illustrated in details below and the similarity between them is not iterated herein.

Referring to FIGS. 2A and 2B, the semiconductor package 2 includes a first die 100A, a second die 100B and an integrated circuit 200. The first die 100A and the second die 100B are bonded to the integrated circuit 200. In some embodiments, bonding structures 120A of the first die 100A are bonded to bonding structures 220 of the integrated circuit 200, and bonding structures 120B of the second die 100B are bonded to bonding structure 220 of the integrated circuit 200. In addition, a conductive feature 216 of the integrated circuit 200 electrically connects the bonding structures 220, so as to electrically connect the first die 100A and the second die 100B.

In some embodiments, the first and second dies 100A, 100B have seal rings 130A, 130B. In some embodiments, the seal ring 130A, 130B is merely disposed at the sides 102b, 102c, 102d, for example. The seal ring 130A, 130B may be continuously disposed along the sides 102b, 102c, 102d. In other words, no seal ring is disposed at the side 102a. Specifically, no seal ring is disposed in a region $R_A$, $R_B$ between the side 102a and the conductive feature 116 connected to the bonding structure 120A, 120B. In other words, the region $R_A$, $R_B$ is a seal ring-free region. Therefore, as shown in FIG. 2A, from a top view, the seal ring 130A, 130B is not overlapped with the conductive feature 216. In some embodiments, the seal ring 130A, 130B may be U-shaped, for example.

In some embodiments, since no seal ring or any other component of the die is disposed in the region RA, RB between the side 102a and the conductive feature 116 connected to the bonding structure 120A, 120B, the space for the seal ring or any other component is not required. In some embodiments, there is merely dielectric layer (i.e., the insulating layer 112) in the region RA, RB, for example. Accordingly, a die-to-die talking path TP is substantially equal to a total of a distance DA between the bonding structure 120A and the side 102a of the first die 100A, a distance DAB between the first die 100A and the second die 100B and a distance DB between the bonding structure 120B and the side 102a of the second die 100B. The distance DA, DB between the bonding structure 120A, 120B and the side 102a is smaller than a distance (such as a distance D3) between the bonding structure 120 and other side 102b, 102c, 102d. In some embodiments, the distance DA, DB between the bonding structure 120A, 120B and the side 102a of the first and second dies 100A, 100B depends on the process window of the photolithography or singulation or placement process of the first and second dies 100A, 100B. In some embodiments, the distance DA, DB may be in a range of 25 μm to 200 μm, for example. In some embodiments, the distance DAB may be in a range of 10 μm to 100 μm, for example. In some embodiments, the length of the die-to-die talking path may be reduced to 60 μm or more, for example. In some embodiments, by removing a portion of the seal ring between the bonding structure and the side adjacent to another die, the talking path between the dies may be shortened.

In some alternative embodiments, the bonding structure 120A, 120B may be disposed closer to the outermost edge of the conductive feature 116, for example, the outermost edge of the bonding structure 120A, 120B may be substantially flush with the outermost edge of the conductive feature 116. Accordingly, the distance $D_A$, $D_B$ may be further reduced, and the length of the die-to-die talking path TP may be shorter.

Figure 3A:
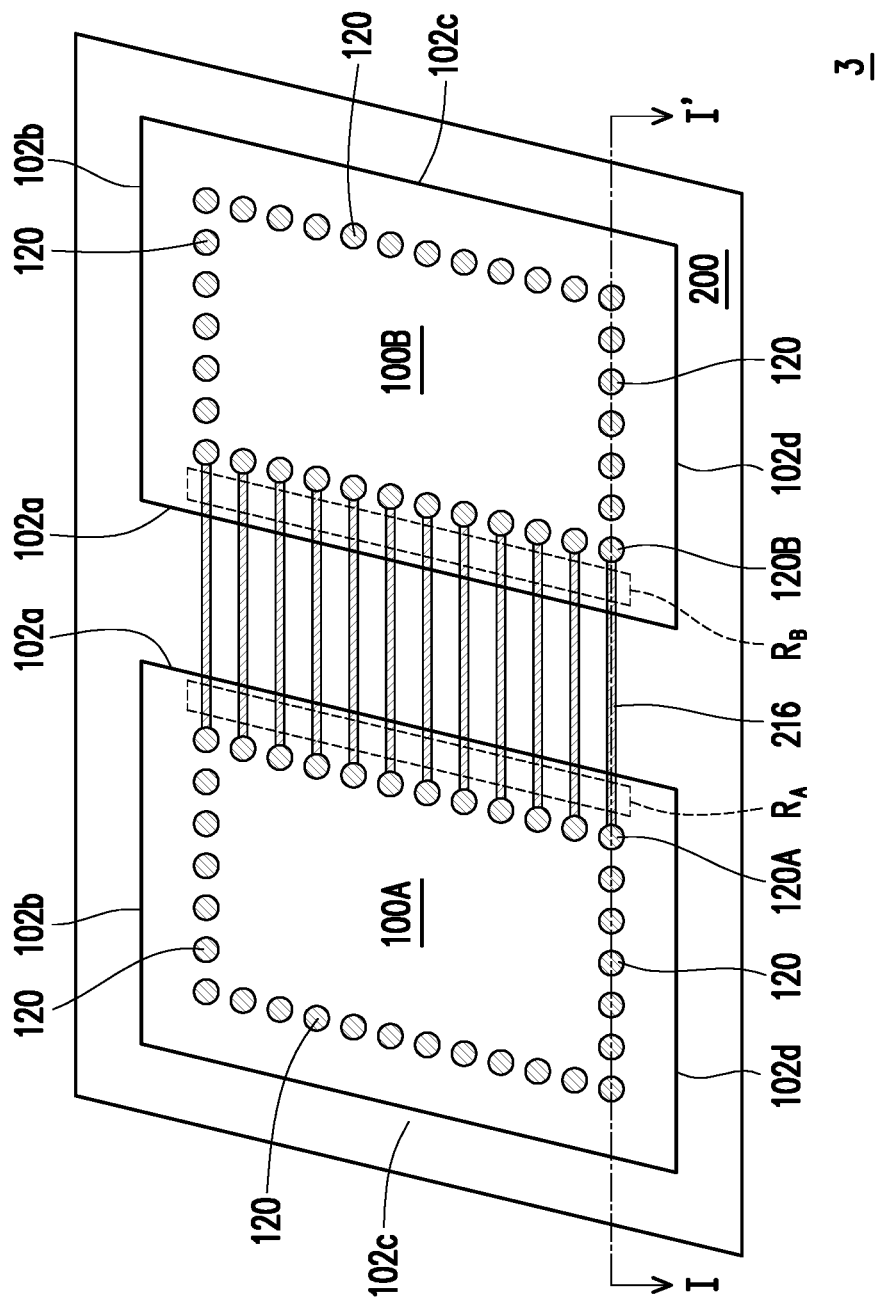
FIG. 3A is a top view of a semiconductor package in accordance with some embodiments.
Figure 3B:
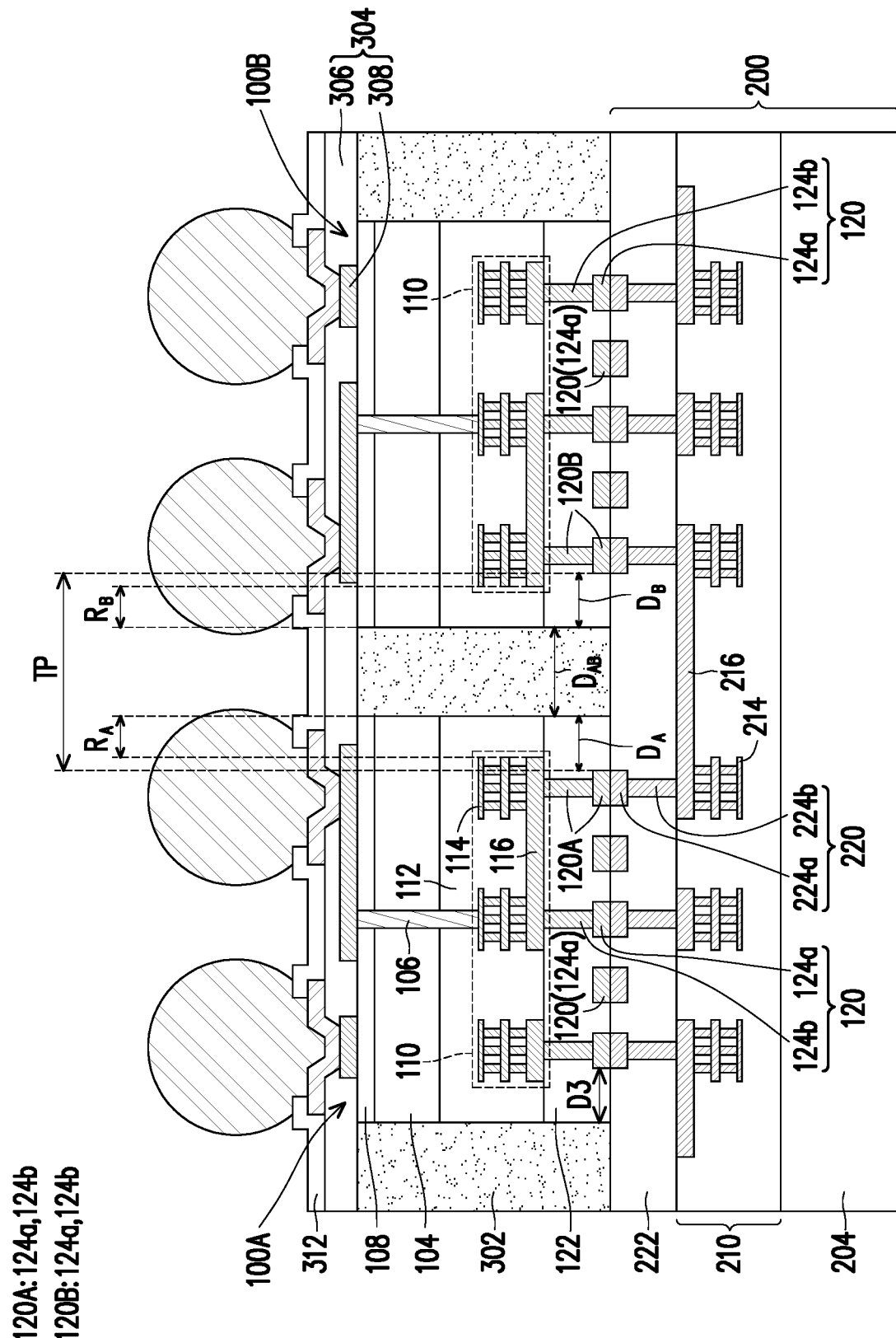
FIG. 3B is a cross-sectional view of a semiconductor package along the line I-I of FIG. 3A in accordance with some embodiments.

FIG. 3A is a top view of a semiconductor package in accordance with some embodiments, and FIG. 3B is a cross-sectional view of a semiconductor package along the line I-I of FIG. 3A in accordance with some embodiments. For simplicity and clarity of illustration, only few elements such as first and second dies, an integrated circuit, bonding structures and conductive features are shown in the simplified top view of FIG. 3A, and these elements are not necessarily in the same plane.

The semiconductor package 3 of FIGS. 3A and 3B is similar to the semiconductor package 1 of FIGS. 1A and 1B. Thus, the difference between the semiconductor package 3 and the semiconductor package 1 is illustrated in details below and the similarity between them is not iterated herein.

Referring to FIGS. 3A and 3B, the semiconductor package 3 includes a first die 100A, a second die 100B and an integrated circuit 200. The first die 100A and the second die 100B are bonded to the integrated circuit 200. In some embodiments, bonding structures 120A of the first die 100A are bonded to bonding structures 220 of the integrated circuit 200, and bonding structures 120B of the second die 100B are bonded to bonding structure 220 of the integrated circuit 200. In addition, a conductive feature 216 of the integrated circuit 200 electrically connects the bonding structures 220, so as to electrically connect the first die 100A and the second die 100B.

In some embodiments, there is no seal ring in the first and second dies 100A, 100B. In other words, the region $R_A$, $R_B$ is a seal ring-free region, and the first and second dies 100A, 100B may be seal ring-free dies. Accordingly, no seal ring is disposed in a region $R_A$, $R_B$ between the side 102a and a conductive feature 116 connected to the bonding structure 120A, 120B.

In some embodiments, since no seal ring or any other component of the die is disposed in the region RA, RB between the side 102a and the conductive feature 116, the space for the seal ring or any other component is not required. In some embodiments, there is merely dielectric layer (i.e., the insulating layer 112) in the region RA, RB, for example. Accordingly, a die-to-die talking path TP is substantially equal to a total of a distance DA between the bonding structure 120A and the side 102a of the first die 100A, a distance DAB between the first die 100A and the second die 100B and a distance DB between the bonding structure 120B and the side 102a of the second die 100B. The distance DA, DB between the bonding structure 120A, 120B and the side 102a is substantially equal to a distance (such as a distance D3) between the bonding structure 120 and other side 102b, 102c, 102d.

In some embodiments, the distance $D_A$, $D_B$ between the bonding structure 120A, 120B and the side 102a of the first and second dies 100A, 100B depends on the process window of the photolithography or singulation or placement process of the first and second dies 100A, 100B. In some embodiments, the distance $D_A$, $D_B$ may be in a range of 25 μm to 200 μm, for example. In some embodiments, the distance $D_{AB}$ may be in a range of 10 μm to 100 μm, for example. In some embodiments, the length of the die-to-die talking path may be reduced to 60 μm or more, for example. In some embodiments, by providing the seal ring-free dies, the talking path between the dies may be shortened.

In some alternative embodiments, the bonding structure 120A, 120B may be disposed closer to the outermost edge of the conductive feature 116, for example, the outermost edge of the bonding structure 120A, 120B may be substantially flush with the outermost edge of the conductive feature 116. Accordingly, the distance $D_A$, $D_B$ may be further reduced, and the length of the die-to-die talking path TP may be shorter.

In above embodiments, the first die 100A and the second die 100B adopt the same technique to reduce the distance between the bonding structure 120A, 120B and the side 102a, however, the invention is not limited thereto. In some alternative embodiments, the first die 100A and the second die 100B may adopt different technique to reduce the distance between the bonding structure 120A, 120B and the side 102a. For example, in some alternative embodiments, a first die may be selected from the first dies 100A in FIGS. 1A to 3B or the like, and a second die may be selected from the second dies 100B in FIGS. 1A to 3B or the like. In addition, although there are two adjacent dies (i.e., the first die and the second die) illustrated, more than two dies may be bonded to the integrated circuit.

In view of the above, the space for the element may be reduced or eliminated by narrowing the width of the element (such as a seal ring), removing a portion of the element (such as a seal ring) or totally removing the element (such as a seal ring) from the die. Therefore, the bonding structure of one die may become closer to the bonding structure of another die. Accordingly, the talking path between the bonding structures of the adjacent dies may be shortened, and the performance of the semiconductor package may be improved.

In accordance with some embodiments of the present disclosure, a semiconductor package includes an integrated circuit, a first die and a second die. The first die includes a first bonding structure and a first seal ring. The first bonding structure is bonded to the integrated circuit and disposed at a first side of the first die. The second die includes a second bonding structure. The second bonding structure is bonded to the integrated circuit and disposed at a first side of the second die. The first side of the first die faces the first side of the second die. A first portion of the first seal ring is disposed between the first side and the first bonding structure, and a width of the first portion is smaller than a width of a second portion of the first seal ring.

In accordance with alternative embodiments of the present disclosure, a semiconductor package includes an integrated circuit, a first die and a second die. The integrated circuit includes a conductive feature. The first die includes a first bonding structure and a first seal ring. The first bonding structure is bonded to the integrated circuit and disposed at a first side of the first die. The second die includes a second bonding structure. The second bonding structure is bonded to the integrated circuit and disposed at a first side of the second die. The first side of the first die faces the first side of the second die. The conductive feature is disposed between and electrically connected to the first bonding structure and the second bonding structure, and the first seal ring is not overlapped with the conductive feature from a top view.

In accordance with yet alternative embodiments of the present disclosure, a semiconductor package includes an integrated circuit, a first die and a second die. The first die includes a first bonding structure and a first conductive feature at a first side of the first die. The first bonding structure is bonded to the integrated circuit and disposed between the integrated circuit and the first conductive feature. The first conductive feature is physically connected to the first bonding structure. The second die includes a second bonding structure at a first side of the second die. The second bonding structure is bonded to the integrated circuit, and the first side of the first die faces the first side of the second die. A region between the first conductive feature and the first side of the first die is a seal ring-free region.

In accordance with yet alternative embodiments of the present disclosure, a forming method of a semiconductor package includes the following steps. A first die is provided. The first die includes a first bonding structure and a first seal ring, the first bonding structure is formed at a first side of the first die, a first portion of the first seal ring is formed between the first side and the first bonding structure, and a width of the first portion is smaller than a width of a second portion of the first seal ring. A second die is provided. The second die includes a second bonding structure. The first die and the second die are bonded onto an integrated circuit through the first bonding structure and the second bonding structure.

In accordance with yet alternative embodiments of the present disclosure, a forming method of a semiconductor package includes the following steps. A first die is provided, and the first die includes a first bonding structure at a first side of the first die and a first seal ring. A second die is provided, and the second die includes a second bonding structure at a first side of the second die. The first die and the second die are bonded onto an integrated circuit through the first bonding structure and the second bonding structure. After bonding, the first side of the first die faces the first side of the second die, and the first seal ring is not overlapped with a conductive feature of the integrated circuit from a top view.

In accordance with yet alternative embodiments of the present disclosure, a forming method of a semiconductor package includes the following steps. An integrated circuit is provided, and the integrated circuit includes a first bonding structure, a second bonding structure and a conductive bridge connecting and being in direct contact with the first bonding structure and the second bonding structure. A first die is provided, and the first die includes a third bonding structure and a seal ring. A second die is provided, and the second die includes a fourth bonding structure. The first die and the second die are bonded onto the integrated circuit through bonding the first bonding structure and the third bonding structure and bonding the second bonding structure and the fourth bonding structure. After bonding, there is no seal ring overlapped with the conductive bridge from a top view.

In accordance with yet alternative embodiments of the present disclosure, a semiconductor package includes a first die. The first die has a first side and a second side different from the first side and includes a first seal ring. The first seal ring includes a first portion at the first side and a second portion at the second side, and a width of the first portion is smaller than a width of the second portion.

In accordance with yet alternative embodiments of the present disclosure, a semiconductor package includes a first die and a second die. The first die includes a first seal ring. The first die and the second die are disposed along a horizontal direction and electrically connected to each other, a first side of the first die faces the second die, and the first seal ring is not disposed at the first side of the first die.

In accordance with yet alternative embodiments of the present disclosure, a semiconductor package includes a first die, a second die and a conductive bridge. The first die includes a first seal ring. The first die and the second die are disposed along a horizontal direction. The conductive bridge extends between the first die and the second die along the horizontal direction, to electrically connect the first die and the second die, and the first seal ring is not overlapped with the conductive bridge from a top view.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first die having a first side and a second side different from the first side and comprising a first seal ring, wherein the first seal ring comprises a first portion at the first side and a second portion at the second side, and a width of the first portion is smaller than a width of the second portion.

2. The semiconductor package of claim 1, wherein the first side is immediately adjacent to the second side.

3. The semiconductor package of claim 1, wherein the first side is opposite to the second side.

4. The semiconductor package of claim 1, wherein the first portion is integrally formed with the second portion.

5. The semiconductor package of claim 1, wherein the first seal ring further comprises a third portion at a third side and a fourth portion at a fourth side, and the width of the first portion is smaller than a width of the third portion and a width of the fourth portion.

6. The semiconductor package of claim 1, wherein the seal ring is an enclosed circle.

7. The semiconductor package of claim 1, further comprising a second die disposed at the first side of the first die and electrically connected to the first die.

8. The semiconductor package of claim 7, further comprising an integrated circuit, wherein the first die and the second die are respectively bonded to the integrated circuit through a first bonding structure and a second bonding structure, and the first portion of the first seal ring is disposed between the first side and the first bonding structure.

9. A semiconductor package, comprising:
a first die comprising a first seal ring; and
a second die, wherein the first die and the second die are disposed along a horizontal direction and electrically connected to each other, a first side of the first die faces the second die, and the first seal ring is not disposed at the first side of the first die.

10. The semiconductor package of claim 9, wherein the first seal ring is continuously disposed at a second side connecting to the first side, a third side connecting to the first side and a fourth side opposite to the first side of the first die.

11. The semiconductor package of claim 9, wherein the second die comprises a second seal ring, and the second seal ring is not disposed at a side of the second die facing the first side of the first die.

12. The semiconductor package of claim 9, wherein the first die and the second die are electrically connected to each other through a conductive feature, and the conductive feature is extended between the first die and the second die along the first direction.

13. The semiconductor package of claim 12, wherein the first seal ring of the first die is not overlapping with the conductive feature from a top view.

14. A semiconductor package, comprising:
a first die comprising a first seal ring;
a second die, the first die and the second die disposed along a horizontal direction; and
a conductive bridge, wherein the conductive bridge extends between the first die and the second die along the horizontal direction, to electrically connect the first die and the second die, and the first seal ring is not overlapped with the conductive bridge from a top view.

15. The semiconductor package of claim 14, wherein the second die is a seal ring-free die.

16. The semiconductor package of claim 14, wherein the conductive bridge is disposed below the first die and the second die.

17. The semiconductor package of claim 14, wherein the conductive bridge is physically connected to a first bonding pad of the first die and a second bonding pad of the second die.

18. The semiconductor package of claim 17, wherein the first and second bonding pads of the first and second dies are respectively overlapped with the conductive bridge from the top view.

19. The semiconductor package of claim 14, wherein the conductive bridge extends between a first side of the first die and a first side of the second die facing the first side of the first die, and the first seal ring is not disposed at the first side.

20. The semiconductor package of claim 19, wherein the second die comprises a second seal ring, and the second seal is not disposed at the first side of the second die.

* * * * *